(12) United States Patent
Ni et al.

(10) Patent No.: US 9,478,263 B2
(45) Date of Patent: Oct. 25, 2016

(54) SYSTEMS AND METHODS FOR MONITORING AND CONTROLLING REPETITIVE ACCESSES TO VOLATILE MEMORY

(71) Applicant: Apple Inc., Cupertino, CA (US)

(72) Inventors: Bin Ni, Sunnyvale, CA (US); Kai Lun Charles Hsiung, Fremont, CA (US); Yanzhe Liu, Sunnyvale, CA (US); Sukalpa Biswas, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 408 days.

(21) Appl. No.: 14/158,404

(22) Filed: Jan. 17, 2014

(65) Prior Publication Data

US 2015/0206558 A1 Jul. 23, 2015

(51) Int. Cl.
*G11C 7/10* (2006.01)
*G06F 12/10* (2016.01)
*G11C 11/408* (2006.01)
*G11C 11/409* (2006.01)

(52) U.S. Cl.
CPC .......... *G11C 7/1072* (2013.01); *G06F 12/1036* (2013.01); *G11C 11/408* (2013.01); *G11C 11/409* (2013.01)

(58) Field of Classification Search
CPC ............... G11C 11/40607; G11C 7/1072
See application file for complete search history.

(56) References Cited

U.S. PATENT DOCUMENTS

| | | | |
|---|---|---|---|
| 2003/0163718 A1* | 8/2003 | Johnson | G06F 12/1408 713/193 |
| 2014/0189228 A1* | 7/2014 | Greenfield | G11C 11/40607 711/106 |
| 2014/0334224 A1* | 11/2014 | Cordero | G11C 11/406 365/149 |
| 2015/0200002 A1* | 7/2015 | Lin | G11C 7/1072 711/106 |

* cited by examiner

*Primary Examiner* — Reginald Bragdon
*Assistant Examiner* — Mehdi Namazi
(74) *Attorney, Agent, or Firm* — Van Court & Aldridge LLP

(57) ABSTRACT

Systems and methods for monitoring and controlling repetitive accesses to a dynamic random-access memory (DRAM) row are disclosed. A method for monitoring and controlling repetitive accesses to a DRAM can include dividing a bank of the DRAM into a number of logical blocks, mapping each row of the bank to one of the logical blocks, monitoring accesses to the logical blocks, and controlling accesses to the logical blocks based on the monitoring.

20 Claims, 4 Drawing Sheets

SYSTEMS AND METHODS FOR MONITORING AND CONTROLLING REPETITIVE ACCESSES TO VOLATILE MEMORY

TECHNICAL FIELD

This patent specification generally relates to volatile memory. More specifically, this patent specification relates to methods and systems for monitoring and controlling accesses to dynamic random-access memory (DRAM).

BACKGROUND

Dynamic random-access memory (DRAM) is a type of random-access memory that stores each bit of data in a separate capacitor within an integrated circuit. Each capacitor can be either charged or discharged and these two states are generally taken to represent the two values of a bit, conventionally called 0 and 1. Since capacitors leak charge, any information stored via DRAM eventually fades unless each capacitor charge is "refreshed" periodically. Because of this refresh requirement, DRAM is considered dynamic as opposed to other types of static memory such as static random-access memory (SRAM).

The data storage units in a DRAM module are typically divided into banks and each bank is arranged into rows. When an address of the DRAM module is to be accessed (i.e., a read or write operation is performed), the entire row containing that address needs to be "activated" before the access and "precharged" after the access. Due to the leakage of electrons through the substrate of the DRAM module, this activate-precharge cycle to a row will cause its neighboring rows to gradually lose their charge. If a row is activated and precharged too many times before its neighboring rows are refreshed, the information stored on the neighboring rows may be corrupted or lost. This problem is also known as "row hammering." Thus, there is a need for methods and systems to monitor and control repetitive accesses to a DRAM row.

SUMMARY

Systems and methods for monitoring and controlling repetitive accesses to a DRAM row are disclosed. Repetitive access to a row without refresh in a DRAM can lead to corruption or loss of data in neighboring rows. The present invention provides systems and methods to monitor if any row of a DRAM chip is being accessed too often without refresh. In the case such activity is detected, actions can be taken to ensure corruption or loss of data will not occur. A method for monitoring and controlling repetitive accesses to a DRAM can include dividing a bank of the DRAM into a number of logical blocks, mapping each row of the bank to one of the logical blocks, monitoring accesses to the logical blocks, and controlling accesses to the logical blocks based on the monitoring.

A further understanding of the nature and advantages of the embodiments discussed herein may be realized by reference to the remaining portions of the specification and the drawings.

DETAILED DESCRIPTION OF THE INVENTION

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

Figure 1:
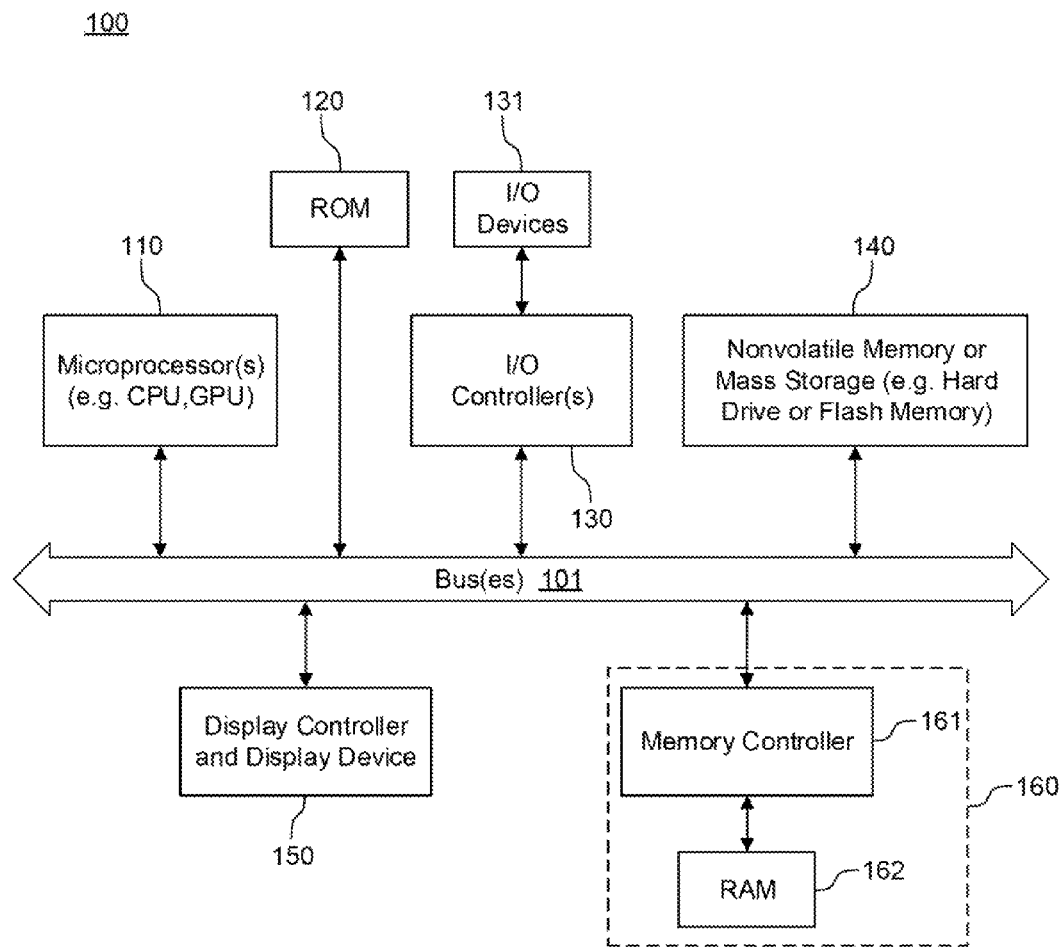
FIG. 1 shows a block diagram that schematically illustrates a computer system which may be used in conjunction with the embodiments described herein.

FIG. 1 shows one example of a computing system which may be used with an embodiment of the present invention. Note that while FIG. 1 illustrates various components of a computing system, it is not intended to represent any particular architecture or manner of interconnecting the components as such details are not germane to the present invention. It will also be appreciated that network computers and other data processing systems which have fewer components or perhaps more components may also be used with the present invention. The computing system of FIG. 1 may, for example, be a personal computer, mobile telephone, or some other computing device from Apple Inc.

As shown in FIG. 1, computing system 100 includes bus(es) 101 which is coupled to microprocessor(s) 110, ROM (Read Only Memory) 120, volatile memory 160, and non-volatile memory 140. Although only a single bus is shown, it is understood that bus(es) 101 may include multiple buses to accommodate communication between the components of system 100. Thus, bus(es) 101 may include one or more buses connected to each other through various bridges, controllers, and/or adapters as is well known in the art. Similarly, it is understood that microprocessor(s) 110 may include any suitable number of processing units. For example, microprocessor(s) 110 may include a central processing unit (CPU) and a graphics processing unit (GPU). The bus 101 interconnects these various system components together and also interconnects components 110, 120, 160, and 140 to a display controller and display device 150 and to peripheral devices such as input/output (I/O) devices which may include mice, keyboards, network interfaces, printers and other devices which are well known in the art. Typically, input/output devices 131 are coupled to system 100 through input/output controllers 130.

Non-volatile memory 140 may be implemented as a magnetic hard drive or a magnetic optical drive or an optical drive or a flash memory or other types of memory systems which maintain data (e.g., large amounts of data) even after power is removed from the system. While FIG. 1 shows that non-volatile memory 140 is a local device coupled directly to the rest of the components in computing system 100, it will be appreciated that system 100 may utilize a non-volatile memory which is remote from the system, such as a network storage device which is coupled to computing system 100 through a network interface such as an Ethernet interface or a wireless network.

As seen in FIG. 1, volatile memory 160 includes memory controller 161 coupled with volatile RAM (Random-Access Memory) 162. Volatile RAM 162 is typically implemented as dynamic RAM (DRAM) which requires power continually in order to refresh or maintain any data stored in the memory. For example, volatile RAM 162 may be implemented as any suitable DRAM such as Synchronous DRAM (SDRAM), Rambus DRAM (RDRAM), Single Data Rate (SDR) DRAM or Double Data Rate (DDR) DRAM. Memory controller 161 contains the logic necessary to read and write to volatile RAM 162, and to refresh the RAM. Although memory controller 161 is shown as part of volatile memory 160, it is understood that memory controller 161 may be a separate chip or integrated into another chip. For example, memory controller 161 may be integrated into one of microprocessor(s) 110.

The system configuration of FIG. 1 is an example configuration, which is chosen purely for the sake of conceptual clarity. In alternative embodiments, any other suitable configuration can also be used. For example, the elements of memory controller 161 may be implemented using hardware circuitry, using software running on a suitable processor, or using a combination of hardware and software elements. In some embodiments, memory controller 161 may include a general-purpose processor, which is programmed in software to carry out the functions disclosed herein. Thus, the techniques are not limited to any specific combination of hardware circuitry and software nor to any particular source for the instructions executed by the computing system.

Figure 2:
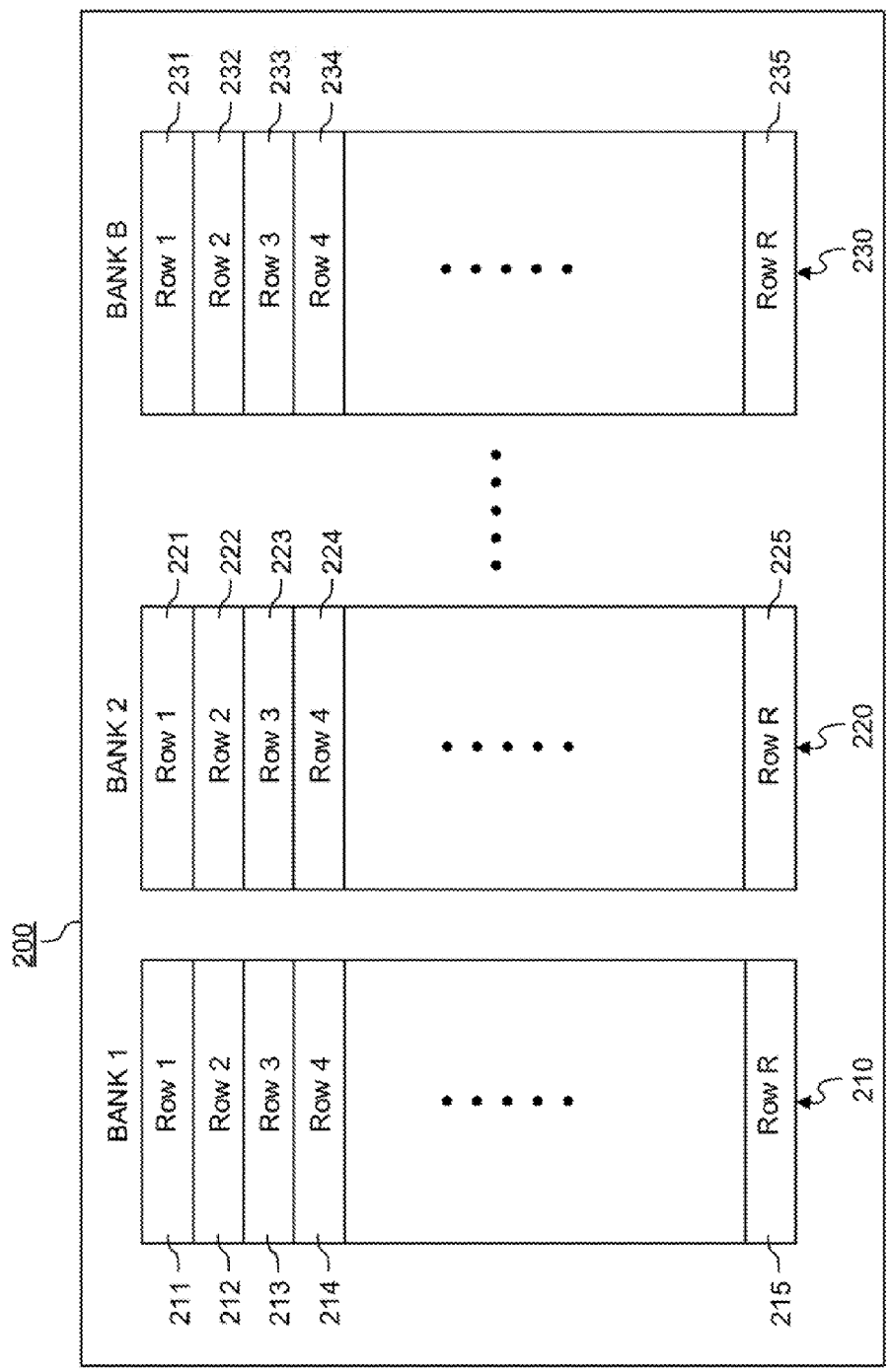
FIG. 2 shows a block diagram that schematically illustrates a DRAM chip in accordance with an embodiment.

Turning now to FIG. 2, a block diagram that schematically illustrates a DRAM chip is shown. DRAM chip 200 may be part of a computing system (e.g., computing system 100 of FIG. 1). For example, volatile RAM 162 in FIG. 1 may contain one or more of DRAM chip 200. As shown in FIG. 2, DRAM chip 200 includes banks 210, 220 and 230. While only three banks are shown, memory chip 200 may be divided into any number banks. For example, chip 200 may be divided into eight banks. Each bank may include several rows. As seen in FIG. 2, bank 210 includes rows 211, 212, 213, 214, and 215, bank 220 includes rows 221, 222, 223, 224, and 225, and bank 230 includes rows 231, 232, 233, 234, and 235. It will be appreciated that banks 210, 220, and 230 may contain any suitable number of rows. Typically, banks in DRAM chips will include tens of thousands of rows.

When an address in DRAM chip 200 is accessed (e.g., read or written to by a component of computing system 100 of FIG. 1), the entire row containing that address needs to be activated before the access and precharged following the access. As an example, an address in row 213 of bank 210 may need to be accessed. Due to the leakage of electrons through the substrate of the DRAM chip 200, the activate-precharge cycle associated with accessing row 213 will cause neighboring rows 212 and 214 to gradually lose their charge. If row 213 is activated and precharged too many times before neighboring rows 212 and 214 are refreshed, information stored on rows 212 and 214 may be corrupted or lost. This problem is also known as row hammering. Typically, the refresh interval and maximum number of activates that can be issued to a row of DRAM chip 200 before its neighbors corrupt or lose data (i.e., a maximum access count) are provided by a specification for DRAM chip 200.

In order to deal with potential row hammering, certain straightforward solutions may be utilized. For example, the refresh interval implemented by a memory controller associated with DRAM chip 200 may be set to refresh each row more frequently. If tREF represents the refresh interval (e.g., the time between subsequent refreshes of any particular row of DRAM chip 200), tRC represents the minimum interval between activates of rows (e.g., between multiple activates of row 212 or alternating activates of rows 212 and 214), and A denotes the maximum number of activates that can be issued to a row of DRAM chip 200 before its neighbors corrupt or lose data, then a refresh interval may be set according to:

$$tREF \leq A*tRC \qquad (1)$$

in order to guarantee that no more than A activates will be issued to any row of DRAM chip 200 before it is refreshed. Thus, data corruption or loss will not occur if the strategy outlined by equation 1 is taken. However, implementing such a strategy may require a significant increase in the number of refreshes performed on rows in DRAM chip 200 over a given period of time. As a result, the usable bandwidth for data transfer to or from memory chip 200 may be significantly reduced. Another example of a straightforward solution may be to set the minimum interval between activates of rows according to:

$$tRC > \frac{tREF}{A}. \qquad (2)$$

Implementing the strategy outlined by equation 2 is another way to ensure no more than A activates can be issued a row of chip 200 before it is refreshed. However, this strategy also can significantly reduce the bandwidth of DRAM chip 200.

Based on the specifications of DRAM chip 200, repetitive activates to a single row in a short period of time may be rare during normal operation. The above-mentioned straightforward solutions impart a significant penalty on system performance in order to account for the rare case where row hammering may occur. Thus, it may be more desirable to monitor commands issued to DRAM chip 200 and only take action if row hammering is happening or about to happen (i.e., an adaptive solution may be implemented). For example, if chip 200 is part of computing system 100 of FIG. 1 (e.g., volatile RAM 162 contains one or more of DRAM chip 200), memory controller 161 may monitor accesses to chip 200 by other components of system 100 and may take action only if row hammering is happening or about to happen to a particular row of chip 200.

One potential adaptive solution may be to assign a counter to each row of DRAM chip 200 in order track the number of activates within a refresh window of size tREF. If a counter is above a pre-determined threshold, then action may be taken (e.g., by memory controller 161) to throttle further access to the row that corresponds to the counter. The pre-determined threshold may be any suitable value, and may, for example, correspond to a maximum access count provided by a specification for DRAM chip 200. Each bank of DRAM chip 200 may contain tens of thousands of rows, however, and implementing and tracking this many counters in hardware or software may be costly, and may require an excessive amount of overhead.

Another potential adaptive solution may be to implement only one counter for each bank of DRAM chip 200 in order to track the number of activates within a refresh window of size tREF. To cover the worst case, an assumption may be made that all activates for each bank are targeting one particular row. If a counter is above a pre-determined threshold, then action may be taken (e.g., by memory controller 161) to throttle further access to the bank that corresponds to the counter. Thus, any throttling would affect the entire bank. This solution may be easier to implement since the number of counters is significantly reduced, but the solution may generate too many "false alarms" (i.e., access to all the rows of a bank may be throttled unnecessarily). As a result, the overall bandwidth of DRAM chip 200 may be reduced during normal use.

Figure 3:
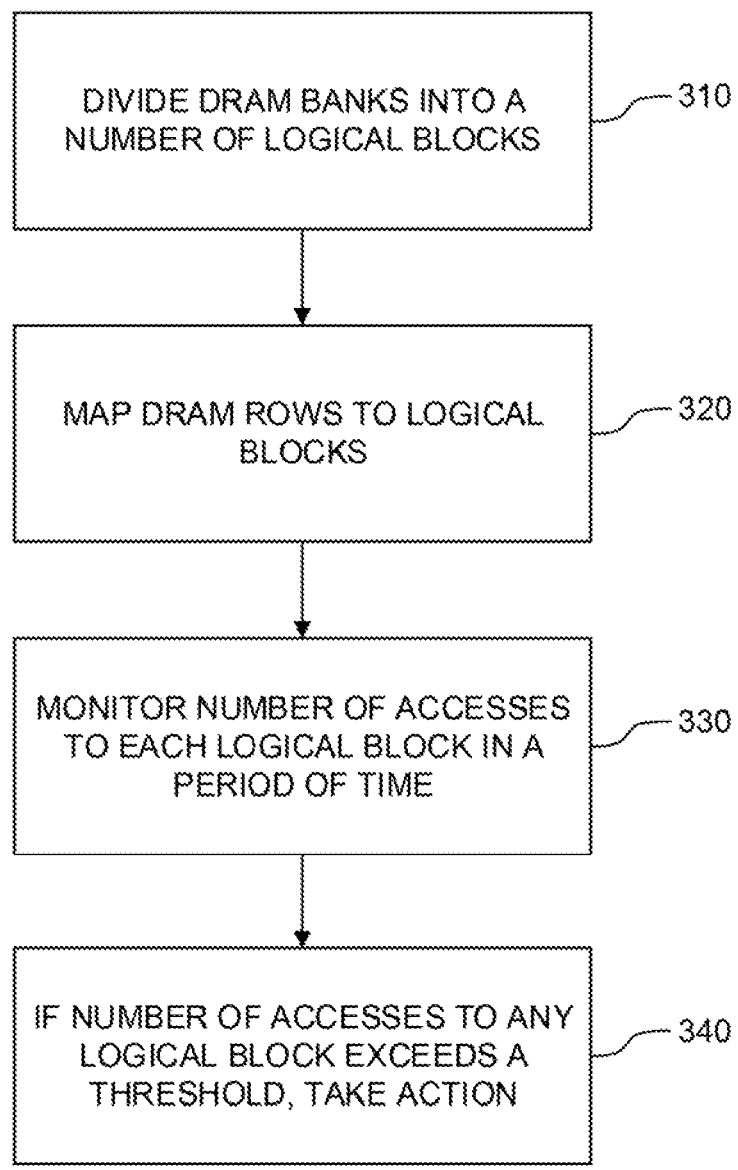
FIG. 3 shows an illustrative method for monitoring and controlling accesses to a DRAM chip in accordance with an embodiment.

Due to the potential drawbacks of the above-mentioned adaptive solutions, a more elegant adaptive solution may be implemented. Referring now to FIG. 3, an illustrative method for monitoring and controlling accesses to a DRAM chip is shown. Method 300 may be used, for example, to monitor and control accesses to DRAM chip 200 as part of a computing system 100 (e.g., volatile RAM 162 contains one or more of DRAM chip 200). Method 300 may be implemented by any suitable component of computing system 100 (e.g., by memory controller 161 or microprocessor(s) 110). Method 300 may begin at step 310 where each bank of a DRAM (e.g., bank 210, 220 and 230 of FIG. 2) is divided into a number of logical blocks. The banks of the DRAM may be divided into any number of suitable logical blocks. For example, dividing the banks into a higher number of logical blocks may result in a lowered false alarm rate, but a higher complexity. Thus, the number of logical blocks may be chosen in order to minimize the probability of a false alarm while keeping the level of complexity acceptable. Method 300 may continue at step 320 where rows of each bank are mapped to one of the logical blocks created in step 310. Rows may be mapped to the logical blocks in any suitable manner. For example, rows of bank 210 may be mapped to logical blocks using a pseudo-random hash-based mapping algorithm. As a further example, the mapping algorithm may be applied to each row address in order to determine which logical block a row is mapped to.

Figure 4:
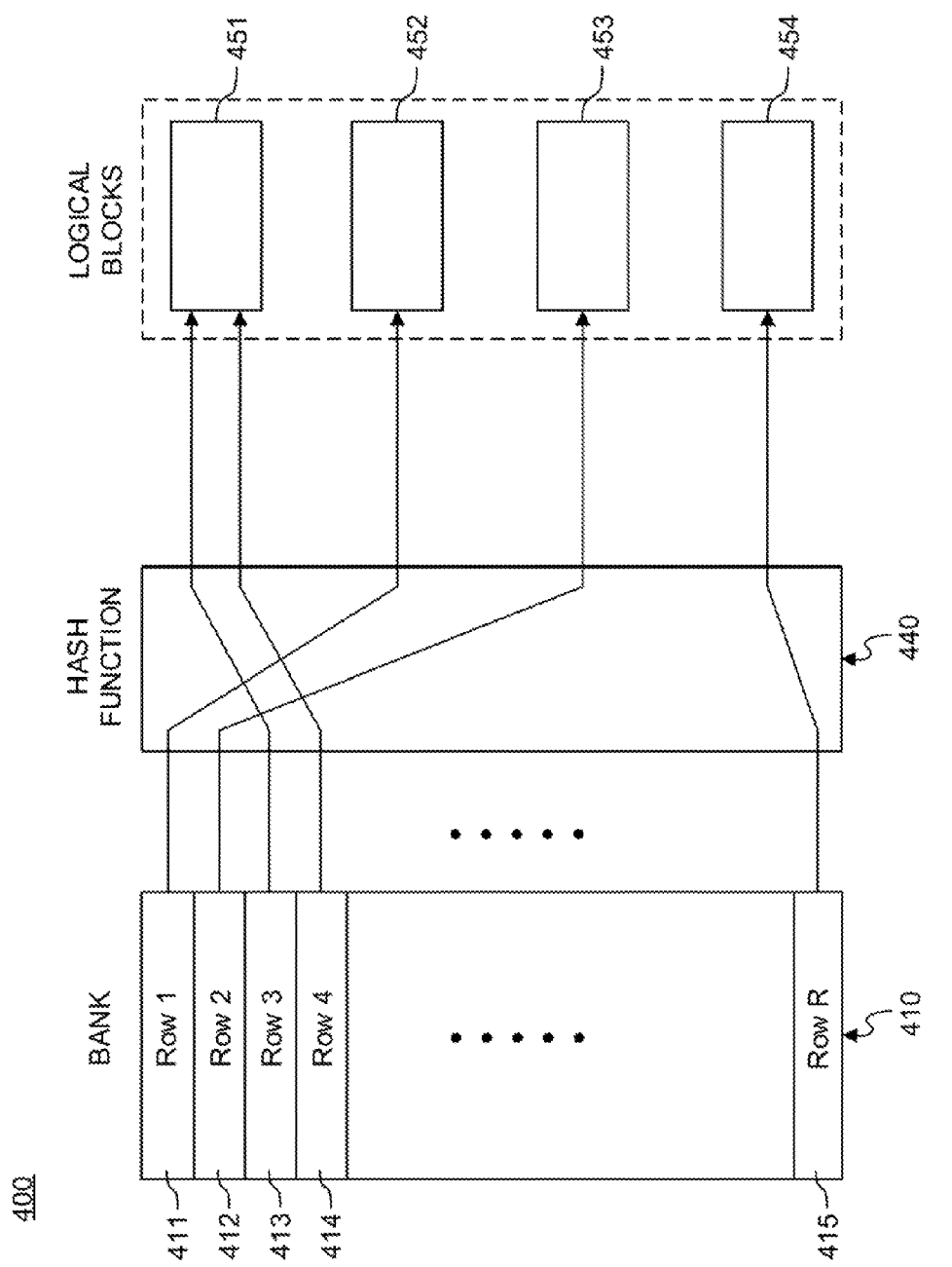
FIG. 4 shows an illustrative diagram that demonstrates how a bank of a DRAM may be mapped to logical blocks in accordance with an embodiment.

Referring briefly to FIG. 4, an illustrative diagram that demonstrates how a bank of a DRAM (e.g., bank 210 of FIG. 2) may be mapped to logical blocks is shown. FIG. 4 may better illustrate how steps 310 and 320 of method 300 can be carried out. As seen in FIG. 4, bank 410 may contain numerous rows (e.g., rows 411-415). The rows of bank 410 may be grouped into any suitable number of logical blocks. For example, as shown in FIG. 4, the rows of bank 410 are divided into logical blocks 451, 452, 453, and 454. The rows of bank 410 may undergo a hash-based mapping algorithm (e.g., hash function 440) in order to map the rows to logical blocks 451-454. Hash function 440 may perform any suitable operation in order to determine the appropriate mapping for rows 411-415 to logical blocks 451-454. As an example, hash function 440 may operate on row addresses for rows 411-415 in order to determine the appropriate mapping. While four logical blocks are shown, it is understood that this number of logical blocks is merely for illustrative purposes. Those skilled in the art will appreciate that as the number of logical blocks is increased, the granularity of row mapping for bank 410 may become finer and as a result, detection of row hammering in any particular row of bank 410 may be enhanced. At the same time, those skilled in the art will also appreciate that increasing the number of logical blocks may result in increased complexity because additional logical blocks may need to be tracked.

Returning now to FIG. 3, following step 320, method 300 may continue with step 330 where accesses to each logical block in a given period of time are monitored. For example, memory controller 161 may monitor the number of accesses to DRAM chip 200 during a specified time period. In order to monitor the number of accesses to each logical block, a counter may be established for each block to track the number of activates issued to that block in a particular time window. The time window may be chosen to be any suitable size. For example, the time window may be chosen to be some fraction of the refresh interval for DRAM chip 200. Additionally, the counters may be set up to track the number of activates in any suitable way. In one embodiment, the counters may track the number of activates issued to each block in a rolling time window of size W microseconds. In other words, the counters keep track of the number of activates issued to each block in the past W microseconds. In this embodiment, the counters may be considered "rolling window counters." In another embodiment, the counters may track the number of activates issued to each block in a fixed time window of size W microseconds. In other words, the counters increment for every activate issued to their corresponding block, and reset to zero every W microseconds. In this embodiment, the counters may be considered "fixed window counters." For both examples of rolling and fixed window counters, increasing the window size W may result in less false alarms, but higher design complexity. It will be appreciated that window size W may be a programmable parameter that can be changed, but may typically be programmed to a value less than the refresh interval for a DRAM chip.

Method 300 may continue with step 340 where if the number of accesses to any logical block exceeds a threshold, action may be taken. For example, if memory controller 161 determines the number of accesses to a logical block exceeds a threshold within the given period of time (i.e., monitoring window) then it may enforce some throttling of activates to the logical block. As mentioned above, ensuring that for any row, the total number of activates to its neighboring rows in a refresh interval is no greater than a maximum number of activates may ensure that no data corruption or loss occurs. For example, as seen in FIG. 2, row 213 has neighboring rows 212 and 214. Ensuring that the total number of activates to rows 212 and 214 is below a maximum number of activates during the refresh interval may ensure that no data corruption or loss occurs in row 213. A more conservative, but easier to manage criteria for ensuring no corruption or loss of data occurs in row 213 may be to ensure that no more than half the maximum number of activates to either row 212 or 214 occurs in the refresh interval. Since rows 212 and 214 may belong to different logical blocks than row 213, the easier to manage criteria more generally becomes ensuring that no more than half the maximum number of activates occurs in any logical block within the refresh interval. If again tREF represents the refresh interval (e.g., the time between subsequent refreshes of any particular row of DRAM chip 200), A denotes the maximum number of activates that can be issued to a row of DRAM chip 200 before its neighbors corrupt or lose data, and W represents the size of the monitoring window then for rolling window counters a threshold T may be defined according to:

$$T = \text{floor}\left(\frac{\frac{A}{2}}{tREF} * W\right), \quad (3)$$

where floor(x) returns the largest integer that is no greater than x. Defining a threshold using the strategy outlined by equation 3 may allow a memory controller to take timely action (e.g., enforce throttling) to ensure data corruption or loss will not occur. Alternatively, in the case where fixed window counters are utilized, a threshold T may be defined according to:

$$T = \text{floor}\left(\frac{\frac{A}{2}}{K+1}\right), \quad (4)$$

where K is defined as:

$$K = \text{ceiling}\left(\frac{tREF}{W}\right), \quad (5)$$

and ceiling(x) returns the smallest integer that is no smaller than x. Similar to the case with rolling window counters, when utilizing fixed window counters, defining a threshold using the strategy outlined by equation 4 may allow a memory controller to take timely action (e.g., enforce throttling) to ensure data corruption or loss will not occur.

As discussed with regard to step 340, action may be taken if the number of accesses to any logical block exceeds a threshold. This action may come, for example, in the form of an adaptive throttling algorithm. The adaptive throttling algorithm may be implemented by any suitable component of a system (e.g., by memory controller 161 of FIG. 1). If the convention of monitoring window size W and threshold T are kept from the previous paragraph, then one embodiment of the adaptive throttling algorithm may be: when a counter value is equal to threshold T, stop issuing activates to the corresponding logical block during the current monitoring window. Another embodiment of the adaptive throttling algorithm may be: when a counter value is equal to 0.75 T, start to enforce a gap of W/(0.25 T) between consecutive activates to the corresponding logical block until the end of the current monitoring window. These embodiments may ensure the total number of activates in any particular monitoring window does not exceed threshold T. Although only two examples of adaptive throttling algorithms are provided, one skilled in the art will appreciate that many potential adaptive throttling algorithms may be used in accordance with the present invention.

Throttling required as a result of row hammering may be performed by any suitable component of a system. In some cases, throttling may be performed by a memory controller (e.g., memory controller 161 of FIG. 1) while in other cases throttling may be performed by another component (e.g., microprocessor(s) 110 of FIG. 1). Determining which component performs throttling may be affected by whether the agent causing row hammering can be isolated. For example, referring to FIG. 1, if memory controller 161 determines that row hammering is being caused by traffic from one of microprocessor(s) 110 (e.g., a CPU of system 100), memory controller 161 may send a signal to the microprocessor telling it to perform throttling, such as instructing it to temporarily cease requests to access volatile memory.

In some embodiments, throttling may only be performed by non-realtime agents. Realtime agents may be defined as agents whose total correctness of an operation (e.g., an access to volatile memory 162) depends not only upon its logical correctness, but also upon the time in which it is performed. For realtime agents, the completion of an operation after its deadline may cause decreased service quality or a critical failure of the system. In contrast, non-realtime agents may be defined as agents whose correctness of an operation is not time sensitive (i.e., they can tolerate tardiness). For example, display device 150 may be considered a realtime agent because delays in accesses to volatile memory 162 may result in decreased service quality (e.g., omitting frames while displaying a video). On the other hand, microprocessor(s) 110 may be considered a non-realtime agent because accesses to volatile memory 162 may not be time sensitive. Thus, in this example, memory controller 161 may send a throttling signal to microprocessor(s) 110, but not to display device 150.

As one skilled in the art will appreciate, in addition to the prevention of row hammering, many benefits may be realized by utilizing method 300 in a computing system containing DRAM. As an example, method 300 may be used to reduce the number of refreshes required for normal DRAM operation to achieve better memory bandwidth utilization. Method 300 may allow the refresh interval for a DRAM to be increased to a value larger than its original specification. In this way, the number of refreshes may be reduced and memory efficiency may be improved. It is understood that while a larger refresh interval may result in an increased false alarm probability, this increased false alarm probability may be compensated for by increasing the number of logical blocks.

Many alterations and modifications of the preferred embodiments will no doubt become apparent to a person of ordinary skill in the art after having read the foregoing description, it is to be understood that the particular embodiments shown and described by way of illustration are in no way intended to be considered limiting. Thus, references to the details of the described embodiments are not intended to limit their scope.

What is claimed is:

1. A method for monitoring and controlling repetitive accesses to a volatile memory, the volatile memory comprising at least one bank including a plurality of rows of cells, the method comprising:
    mapping each row to one of a plurality of logical blocks;
    managing a counter for each of the logical blocks, wherein each counter increases when any row mapped to a particular logical block is accessed within a monitoring window, wherein the monitoring window comprises a time period that is less than a refresh interval of the volatile memory;
    selectively throttling access to rows mapped to a first one of the logical blocks when the counter associated with the first logical block exceeds a threshold to prevent row hammering, wherein the threshold is derived based on the following equation:

$$T = \text{floor}\left(\frac{\frac{A}{2}}{tREF} * W\right)$$

wherein T is the threshold, A is a maximum number of activates, tREF is the refresh interval, and W is the monitoring window.

2. The method of claim 1, wherein the mapping comprises applying a pseudo-random hash-based mapping algorithm to the volatile memory.

3. The method of claim 1, wherein the monitoring window is a fixed time window.

4. The method of claim 1, wherein the monitoring window is a rolling time window.

5. The method of claim 1, wherein the selective throttling comprises:
preventing any further activates of any row mapped to the first logical block within the monitoring window.

6. The method of claim 1, further comprising:
enforcing a gap between consecutive activates to rows in the first block, until an end of the monitoring window by preventing activates to rows in the first block when the counter associated with the first logical block exceeds a fraction of the threshold.

7. The method of claim 1, further comprising:
determining a source of row activates;
wherein the selective throttling comprises instructing the source to temporarily cease requests to access the volatile memory.

8. A system comprising:
a volatile memory comprising at least one bank comprising a plurality of rows; and
a memory controller coupled to the volatile memory, the memory controller operative to:
map each of the plurality of rows to one of a plurality of logical blocks;
define a monitoring window;
maintain counters for each of the logical blocks, wherein a counter is incremented anytime a row associated with a logical block is accessed within the monitoring window;
determine whether any one of the counters exceeds a threshold, wherein the threshold is derived based on the following equation:

$$T = \text{floor}\left(\frac{\frac{A}{2}}{tREF} * W\right)$$

where T is the threshold, A is a maximum number of activates, tREF is the refresh interval, and W is the monitoring window; and
limit activates to rows associated with any of the logical blocks having counters that exceed the threshold.

9. The system of claim 8, wherein the monitoring window is a fixed window.

10. The system of claim 8, wherein the monitoring window is a rolling window.

11. The system of claim 8, wherein the refresh interval is one of the same as and greater than a refresh interval obtained from a specification of the volatile memory.

12. The system of claim 8, wherein the controller is operative to map the rows to a first number of logical blocks based on the refresh interval.

13. The system of claim 8, further comprising:
a plurality of components other than the controller and the volatile memory that access the volatile memory, wherein the controller is further operative to:
instruct at least one of the components to at least temporarily cease accessing the volatile memory when that at least one component is responsible for causing at least one or more counters to exceed the threshold.

14. The system of claim 8, further comprising:
at least one component that functions as a realtime agent; and
at least one component that functions as a non-realtime agent,
wherein the controller is operative to:
determine if one of the at least one component that functions as a non-realtime component is responsible for volatile memory accesses that causes one of the counters to exceed the threshold;
instruct that component to at least temporarily cease accessing the volatile memory.

15. The system of claim 8, wherein the volatile memory is dynamic random access random access memory.

16. A method for monitoring and controlling repetitive accesses to a volatile memory, the volatile memory comprising at least one bank including a plurality of rows of cells, the method comprising:
mapping each row to one of a plurality of logical blocks;
managing a counter for each of the logical blocks, wherein each counter increases when any row mapped to a particular logical block is accessed within a monitoring window, wherein the monitoring window comprises a time period that is less than a refresh interval of the volatile memory;
selectively throttling access to rows mapped to a first one of the logical blocks when the counter associated with the first logical block exceeds a threshold to prevent row hammering, wherein the threshold is derived based on the following equation:

$$T = \text{floor}\left(\frac{\frac{A}{2}}{K+1}\right)$$

where T is the threshold, A is a maximum number of activates, and K is defined as:

$$K = \text{ceiling}\left(\frac{tREF}{W}\right)$$

and where tREF is the refresh interval and W is the monitoring window.

17. The method of claim 16, wherein the mapping comprises applying a pseudo-random hash-based mapping algorithm to the volatile memory.

18. The method of claim 16, wherein the selective throttling comprises:
preventing any further activates of any row mapped to the first logical block within the monitoring window.

19. The method of claim 16, further comprising:
enforcing a gap between consecutive activates to rows in the first logical block, until an end of the monitoring window by preventing activates to rows in the first logical block when the counter associated with the first logical block exceeds a fraction of the threshold.

20. The method of claim 16, further comprising:
determining a source of row activates;

wherein the selective throttling comprises instructing the source to temporarily cease requests to access the volatile memory.

\* \* \* \* \*